United States Patent [19]
Buck

[11] 3,878,532
[45] Apr. 15, 1975

[54] HIGH-FREQUENCY ANALOGUE TO DIGITAL CONVERSION APPARATUS

[75] Inventor: Daniel C. Buck, Hanover, Md.

[73] Assignee: Westinghouse Electric Corporation, Pittsburgh, Pa.

[22] Filed: June 5, 1972

[21] Appl. No.: 259,431

[52] U.S. Cl. ............. 340/347 AD; 315/3; 315/5.24; 315/21 CD; 340/347 P
[51] Int. Cl. ............. G08c 5/00
[58] Field of Search ........ 315/3, 5.24, 21 R, 21 CD; 340/347 AD; 343/100 S, 100 A, 854

[56] References Cited

UNITED STATES PATENTS

| | | | |
|---|---|---|---|
| 2,516,752 | 7/1950 | Carbrey | 315/21 CD |
| 2,616,060 | 10/1952 | Goodall | 315/21 CD |
| 2,786,880 | 3/1957 | McKay | 315/21 R |
| 3,280,361 | 10/1966 | Goldberg et al. | 315/3 |
| 3,281,696 | 10/1966 | Battail | 340/347 AD |
| 3,329,950 | 7/1967 | Shafer | 340/347 AD |
| 3,504,222 | 3/1970 | Fukushima | 315/3 |
| 3,725,803 | 4/1973 | Yoder | 315/3 |

*Primary Examiner*—Maynard R. Wilbur
*Assistant Examiner*—T. M. Blum
*Attorney, Agent, or Firm*—J. B. Hinson

[57] ABSTRACT

Apparatus is described for operation at high frequencies to convert analogue signals into corresponding digital signals. The high-frequency apparatus includes means such as an electron gun for producing a beam of electrons which is directed onto a target assembly of elements capable of providing a high degree of amplification of the incident electron beam. More specifically, the target assembly includes an apertured plate and semi-conductor target elements disposed to receive the electron beam directed through the apertures of the plate. The analogue signal is applied to a suitable deflection mechanism for scanning the electron beam across the face of the target assembly. By arranging the apertures of the target assembly in defined array according to a suitable code for digital information, the semi-conductor members may provide signals at separate output terminals corresponding to the desired quantization or levels of the analogue signals. For high-frequency operation, the electron deflection mechanism may assume the form of a traveling wave circuit such as a meander line to which is applied the high-frequency analogue input signal.

14 Claims, 13 Drawing Figures

HIGH-FREQUENCY ANALOGUE TO DIGITAL CONVERSION APPARATUS

BACKGROUND OF THE INVENTION

1. Field of the Invention

This invention relates to apparatus for converting analogue signals to digital signals and more particularly to such apparatus for operating at high frequencies.

2. Description of the Prior Art

There is presently available analogue to digital conversion apparatus and digital signal processing apparatus for operation in the order of 10 MHz; and there has been indication that specially adapted apparatus is available for operating upon signals of less than 100 MHz. In the prior art, conventional logic circuitry has been used to achieve the digital to analogue conversion of input signals; however, as the frequency of the input signal rises, the losses presented by normal components become sufficiently large to render apparatus unusable at the higher frequencies contemplated by this invention.

In U.S. Pat. No. 2,616,060 to William N. Goodall, there is described an electron discharge device, commonly known as a cathode-ray tube, in which an electron beam is formed and is directed onto an apertured target member. More specifically, an electron gun is provided for forming and focusing the electrons into a substantially flat beam. An analogue signal is applied to a pair of deflection plates for scanning the electron beam across the face of the target member. The target member has a plurality of apertures disposed in a pattern to provide a plurality of output signals corresponding to a desired code, upon a plurality of output terminal wires which are disposed for receiving the electrons directed through the corresponding apertures and for providing an electrical signal corresponding to the incident electron beam. Further, the beam of electrons is deflected along a Y axis according to the analogue input signal whereas the X deflection is carried out to provide a predetermined scanning of the target member.

At present, there is a need to extend the present analogue to digital conversion apparatus into the low microwave range for wide band digital signal processing. In considering the theoretical limits of analogue to digital conversion, Shannon's sampling theorem states that the upper limit or bound of the bandwidth of the analogue signal to be sampled is one-half the sampling repetition rate. In other words, the rate at which the input analogue signal is sampled determines the bandwidth of the input, analogue signal that may be accepted by this apparatus. An additional restriction on the rate of sampling arises from the acceptable ambiguities incurred in the quantization levels into which the input analogue signal is to be quantizied. The second limitation particularly applies to the analogue to digital conversion apparatus of this invention where highfrequency input signals are employed.

By analysis of a typical analogue input signal such as a sine wave where the sampling period $T_s = 1/f_2$ ($f_s$ = sampling rate and $\tau s$ = the sampling interval imposed on the input sine wave), it can be demonstrated that the following condition should be satisfied in order to avoid ambiguity in the quantization level: $(\tau s/T_s)=(2/\pi)\mathrm{SIN}^{-1}[2^{-(N-1)}]$, where $N$ = the number of desired bits. By solving this equation for typical values, it can be shown that for numbers of bits up to seven, sampling rates $f_s$ can be achieved in the order of one GHz. For example, a seven bit word at a one GHz sampling rate requires sampling pulses of a maximum sampling interval of 10 ps. For a four bit word at a one GHz sampling frequency $f_s$ sampling pulses of 80 ps are required.

To insure that quantization of high-frequency analogue signals will be achieved to an unambiguous degree, problems will arise due to the required decrease of $\tau_s$. More specifically, $\tau_s$ may be decreased to a magnitude that, if a scanning beam of electrons is used, the number of electrons in that beam or cloud becomes small enough to allow statistical fluctuations in electron emission to hinder the detection of the sampled analogue signal. Since the output signal to be derived from the analogue conversion apparatus to be described herein is a digital pulse for triggering a threshold device, the number of electrons per sampling pulse can be fairly small in the order of approximately a thousand. Thus, where it is desired to process analogue input signals in the order of one GHz, the electron beam current may be calculated to be in the order of $1.6 \times 10^{-4}$ amps. For a sampling rate requiring a maximum duration of 10 ps., the electron beam current would be in the order of 16 microamps. Therefore, the electron discharge device to be incorporated into the apparatus of this invention must be capable of detecting and processing electron beams of small total current.

A further problem arises in the use of typical electron discharge devices of the prior art when input signals of high-frequency are used to deflect an electron beam. If an electron discharge device with typical deflection circuitry such as electrostatic plates were used, the transit time $t$ for the electron beam to traverse to the plates would be in the order of a large fraction of one cycle of the analogue signal. With such small transit angles, typical deflection plates are incapable of deriving the desired electron beam deflection sensitivity. Deflection sensitivity is understood to be proportional to:

$$\frac{\sin\theta}{\theta},$$

where $\theta$ is that transit angle defined as $$\theta = \frac{wt}{Ve},$$

where $Ve$ is the electron velocity and $w$ is defined as $2\pi$ times the frequency $f$ of the analogue deflecting signal. Thus if input signals of high-frequency in the order of microwaves were applied to the deflection plates of a typical electron discharge device to deflect the electron beam across a patterned target similar to that of U.S. Pat. No. 2,616,060, deflection sensitivity of the electron beam would be highly frequency-dependent, thus distorting the digital coded equivalent of the input analogue signal, and limiting its bandwidth.

SUMMARY OF THE INVENTION

Thus, it is an object of this invention to convert analogue signals of high-frequency bandwidth to corresponding digital signals without distortion.

It is a more specific object of this invention to convert high-frequency analogue signals of the order of one GHz to digital signals without loss or ambiguity of the quantization levels.

It is a still further object of this invention to deflect electron beams of exceptionally small total current in accordance with analogue input signals of high-frequency.

These and other objects are accomplished in accordance with the teachings of this invention by providing an analogue to digital conversion apparatus comprising an electron discharge device including an electron gun for directing a beam of electrons onto a target assembly having the property of multiplying or amplifying the incident electron beam and for providing an output signal corresponding thereto. The analogue input signal is applied to suitable deflection means to thereby deflect the electron beam across the surface of a target assembly. The surface of the target assembly comprises a plurality of effective portions disposed in a patterned array so that digital signals from selected effective portions of the target assembly corresponding to the discrete amplitude levels of the input analogue signal.

In an illustrative embodiment of this invention, the target assembly may take the form of a masking plate having a plurality of apertures disposed therein in a patterned array for providing the desired digital output signals. The electron beam passing through the aforementioned apertures is directed onto a semi-conductor member corresponding to each quantization level of the input analogue signal. Illustratively, the semiconductor member may include a reversed biased PIN junction for exhibiting the property of electron bombardment induced conductivity to thereby achieve a significant multiplication of the incident electron beam.

It is a further aspect of this invention that the deflection means may take the form of a high-frequency device for establishing a traveling wave according to the input analogue signal, in synchronism with the electron beam. Illustratively, the high frequency device could be a meander line.

In accordance with another aspect of this invention, high-frequency sampling of the analogue input signal could be achieved by rapidly deflecting in a first direction the electron beam of this device across an apertured plate to provide emerging therefrom electron beam segments. The electron beam segments may then be deflected across the target assembly in a second direction substantially perpendicular to the first direction.

In a further aspect of this invention, the electron discharge device described above may be operated to generate in parallel fashion digital signals which may be encoded in a binary fashion. In order to achieve an n-bit encoding, n beams of electrons would be generated and deflected across the surface of the target assembly by a common deflection circuit. By appropriately patterning the apertures of the aperture plate, n output signals may be derived which are encoded in a binary fashion. In such an illustrative embodiment, the output binary digital signals may be further coded by placing suitable delay means such as lenses within the electron beam paths to provide programmed delays to each of the end beams of electrons. Thus, the output signals may be provided with predetermined delays to ensure the secure transmission of the output encoded signals and for reconstruction of the transmitted encoded signals in accordance with the programmed delays imparted to each of the electron beams.

In a still further aspect of this invention, the electron discharge device described above may be used in a radar or other transmission system for providing encoded signals according to the patterned apertures of the target assembly plate to selectively energize corresponding elements of an antenna array and to provide a selected phase delay to the waves generated from each element of the antenna array. In accordance with the teachings of this invention, the various degrees of delay may be encoded by selectively patterning the apertures of the target assembly. An electron beam may be scanned thereacross in a selected path to provide desired phase delays to each element of the antenna array. Further, the current density of the electron beam may be regulated in a predetermined pattern to control the spatial sidelobe distribution and amplitude of the wave transmitted from the array as a function not only of the array, but also of the target to be detected.

BRIEF DESCRIPTION OF THE DRAWINGS

These and other advantages of the invention will become more apparent from the following detailed description as considered with the drawings in which.

DETAILED DESCRIPTION OF THE INVENTION

Figure 4A:
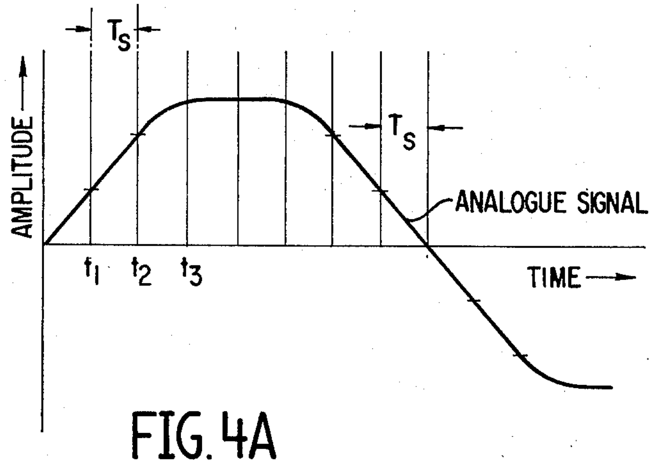
FIGS. 4A and 4B are graphical representations respectively of an input analogue signal and the corresponding levels of quantization of the digital output signals.
Figure 4B:
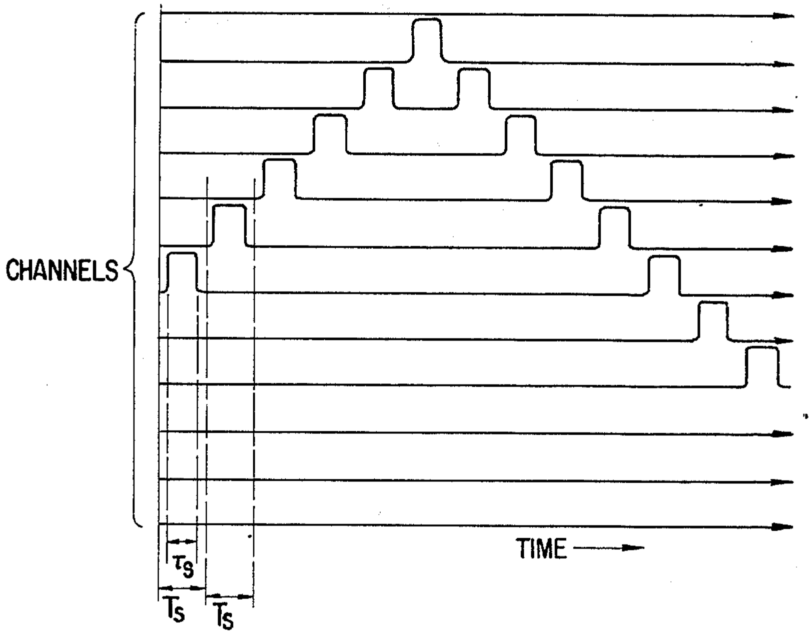

In an analogue to digital converter, an analogue signal having a continuously varying amplitude such as a sine wave is processed to derive a signal indicative of the discrete amplitude levels or levels of quantization of the input analogue signal. In order to achieve the desired quantization, the analogue input signal is sampled at periodic discrete intervals in time. It may be understood that as the frequency of the sampling increases, the difference between the quantization levels at successive samples decreases and possibly ambiguity in the levels of quantization within individual samples is likewise increased. In accordance with the teachings of this invention, it is desired to provide a digital signal from a plurality of output terminals or channels corresponding to each bit of a binary code. Thus, for a four bit code as discussed below with regard to various illustrative embodiments of this invention, there will be required four output terminals upon which will be generated binary signals in a parallel fashion indicative of the amplitudes of the input analogue signal. With regard to FIG. 4A, there is shown a typical analogue input signal taking the form illustratively of a sine wave. The sine wave is sampled at time $t_1$, $t_2$, etc., which are spaced at a uniform distance $T_s$ apart to determine the relative levels at which the input analogue signal is to be sampled. In FIG. 4B, there is shown a plurality of pulses derived from the sinusoid wave and disposed upon channels corresponding to each level of quantization as determined by the sampling rate of the analogue signal.

Figures 1, 3:
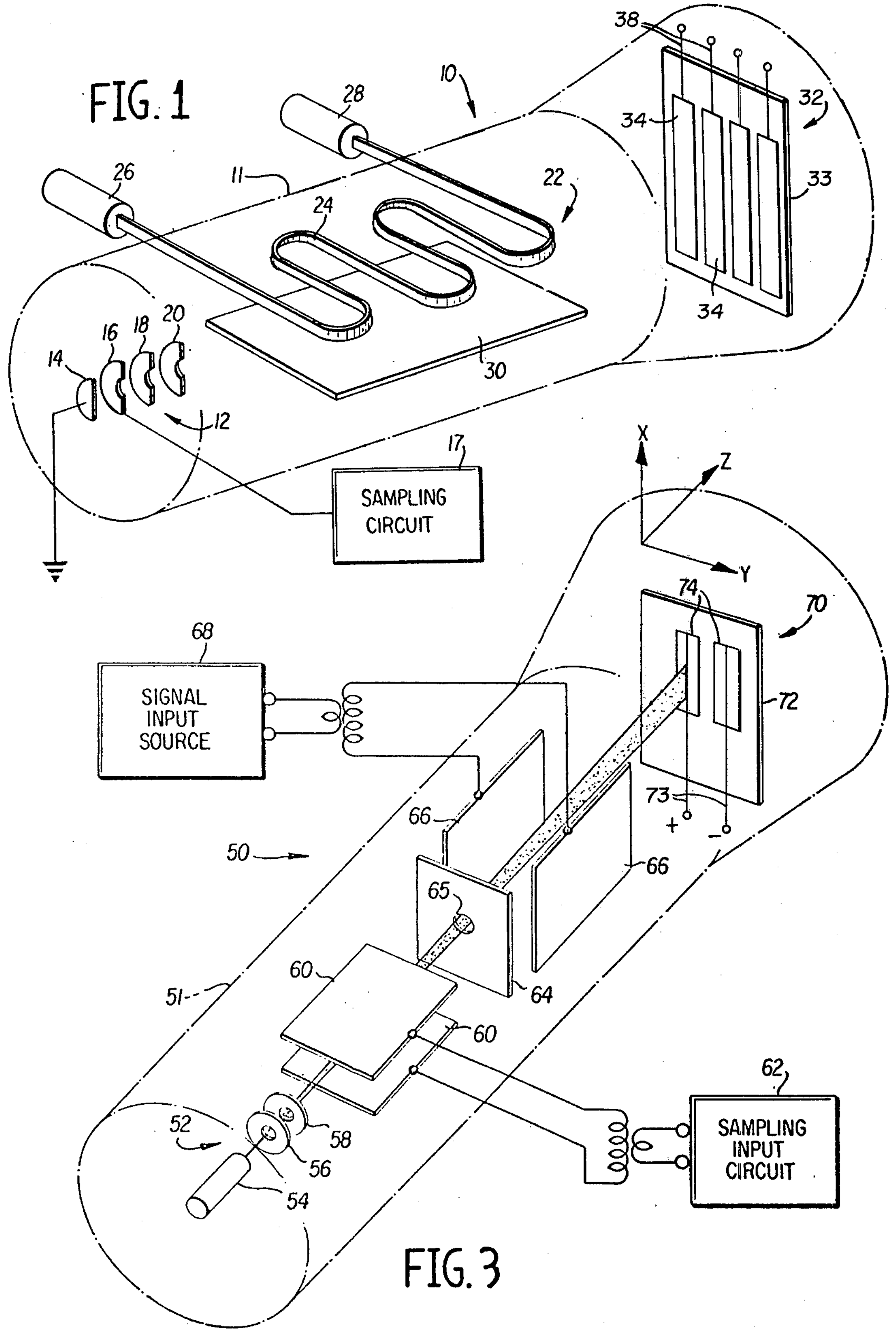
FIG. 1 is a perspective view of an electron discharge device in accordance with the teachings of this invention.
FIG. 3 is a perspective view of a further embodiment of this invention adapted for deflection sampling of high-frequency input signals.

With regard to the drawings and in particular to FIG. 1, there is shown an analogue to digital conversion apparatus illustratively taking the form of an electron discharge device 10 comprising an evacuated envelope 11 into which there is disposed an electron gun 12 for generating and directing a beam of electrons onto the surface of a target assembly 32. It should be noted that the materials and details of construction of the electron discharge device may be chosen from many alternatives well-known in the art. Typically, the electron gun 12 would include a cathode element 14 for emitting a cloud of electrons and suitable grids 16, 18 and 20 for forming the electrons into a beam to be directed onto the target assembly 32. In order to provide the necessary sampling, a sampling circuit 17 is provided for applying a sampling signal comprising periodic pulses spaced a duration apart corresponding to $T_s$, to the grid element 16 to alternatively permit and prevent the transmission of electrons therethrough. Thus, the electron "beam" resembles a series of bursts or segments corresponding to the sampling rate of the signal derived from the circuit 17.

A significant aspect of this invention resides in the means for deflecting the electron beam across the surface of the target assembly 32. In order to deflect the electron beam in accordance with the amplitude of an input analogue signal of microwave frequencies, it is not sufficient to use a simple pair of deflection or electrostatic plates to deflect the electron beam due to transit time effects. More specifically, as the frequency of input analogue signal increases, the amplitude of the field established thereby on simple deflection plates would be changing so rapidly with respect to the transit time of the electron beam across the deflection plates, that the electron beam would not be deflected accurately in accordance with the amplitude of the input signal. At these contemplated frequencies, it is necessary to establish a traveling signal voltage wave in synchronism with the electron beam. Such high-frequency beam deflection means may take the form, as shown in FIG. 1, of a meander line 24 which is connected by an input terminal 26 to the input analogue signal. The other end of the meander line 24 is connected to an output terminal 28 which in turn may be coupled to a terminating impedance to prevent reflected waves. When an input analogue signal of microwave frequency is applied to the input terminal, a traveling wave is established between the meander line 24 and a base plate 30 to thereby deflect rapidly the electron beam or a balanced pair of meander lines can be used.

A principal aspect of this invention resides in the use of a particular target assembly capable of amplifying or multiplying the incident electron beam, which, as explained above, has relatively low current densities at higher frequencies. As shown in FIG. 1, the target assembly 32 includes a support plate 33 disposed within the evacuated envelope 11 for supporting a plurality of semiconductor target elements or members 34. Though only five such target elements are shown, it is realized that many more such elements could be so supported. Assuming that the diameter of the electron beam could be reduced to approximately $0.5 \times 10^{-3}$ inch and a 1 inch maximum deflection of the electron beam, a resolution in the order of $10^2$ to 103 elements could be readily achieved.

Figure 2:
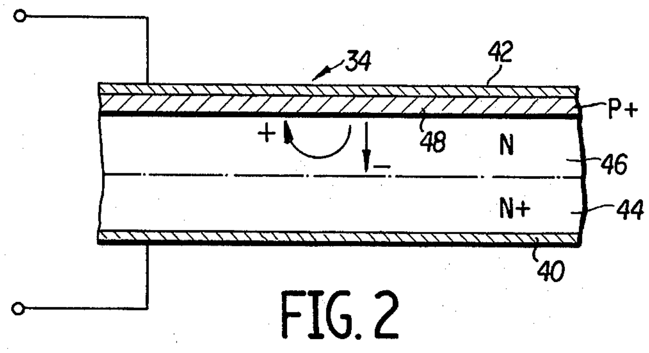
FIG. 2 is an enlarged, cross-sectioned view of a semiconductor target member to be incorporated into the electron discharge device of FIG. 1.

With regard to FIG. 2, there is shown an enlarged view of a single target element 34 capable of achieving the desired electron multiplication. More specifically, there is shown a PIN junction formed between a region 46 of an N type semiconductive material. A region 44 of N+ type conductivity is formed between the N type region 46 and a layer 40 of electrically conductive material which may be disposed upon the region 44 by metal evaporation. A suitable potential source (not shown) is connected to the layer 40 and to a layer 42 for establishing a reverse bias to the PIN junction formed between the regions 46 and 48. Further, a suitable potential source (not shown) may also be applied to the layer 42 to accelerate the electrons to a potential in the order of 10 to 20 kv. The electron beam accelerated to this potential penetrates the layer 42 of metal to create electron-hole pairs of the PIN junction formed between the regions 46 and 48. The holes are diffused out quickly, while the electrons drift across the intrinsic region to be collected at the layer 40. Using this meachnism, referred to as electron bombardment induced conductivity (EBIC), electron multiplication ratios of 2,000 to 4,000 have been achieved. Assigning an energy level of 3.6 ev to each electron-hole pair so created and accelerating the electrons to a potential of approximately 10 kv would result in an approximate multiplication factor of 2,000 even with an approximate 3 kv loss of energy occurring in the electron transmission through the metallical layer 42. The rise time response for the injected beam of electrons is in the order of sub-nano seconds (e.g., <0.1 NS), thus providing a suitable mechanism for use at high frequencies. Further, the high electron multiplication achieved by this mechanism permits electron beams of very low current densities to be used thus permitting sampling rates at very high frequencies in the order of one GHz. The semiconductor mechanism used herein is further described in an article by Norris appearing in the "Proceedings of the Tenth Modulator Symposium;" New York City, N.Y.; 21, 22 May, 1968; pages 108–154.

Though an illustrative target element has been shown in FIG. 2 for achieving high signal amplification through electron multiplication, complementary structures could achieve similar gain by hole multiplication. Thus a target element would be formed of a semiconductor body comprised of an $N^+$ region, an N region and a $P^+$ region, wherein hole multiplications are created in response to incident high energy electrons. The output signal pulses derived by either the hole or the electron multiplication mechanism is of relatively long duration as compared to the short bursts of incident electrons. As a result, the processing circuit for these output pulses does not require a very high frequency capability, e.g., 10 GHz.

As shown in FIG. 1, the output terminal 38 derived from each of these semiconductors target elements 34 is isolated from one another so that the signals derived therefrom depend upon the electron beam being deflected thereacross. By disposing the semiconductor target elements 34 along the horizontal Y dimension as shown in FIG. 1, the output signals derived from the terminals 38 are indicative of the amplitude or magnitude of the input analogue signal. The input signal in turn determines the degree of electron beam deflection and therefore upon which element 34 the electron beam is directed. To generate these signals in digital form, the electron beam is sampled as described above by placing a periodic signal upon the low capacitance grid 16 of the electron gun 12.

As the sampling rate of the periodic signal applied to the grid of the electron discharge device of FIG. 1 becomes progressively higher into the mid and high microwave band waves, the use of a conventional grid-cathode electron gun no longer becomes feasible. At such high sampling rates, the grid no longer functions to alternately turn on and off the electron beam. In accordance with one aspect of this invention, an electron discharge device 50 is shown in FIG. 3 to achieve high sampling rates in the mid to high microwave band without adversely affecting the operation of the analogue to converter. More specifically, the electron discharge device so includes an evacuated envelope 51 in which there is disposed an electron gun 52 for generating and directing an electron beam onto a target assembly 70. The electron gun 52 includes a cathode element 54 for generating electrons and a plurality of grids 56 and 58 for forming and directing the electron beam. Sampling is accomplished in accordance with the teachings of this aspect of the invention by deflecting the electron beam across a sampling plate 64 having an aperture 65 therein. The electron beam is directed between a pair of sampling deflection plates 60 to which a periodic signal is applied by a sampling input circuit 62. As the electron beam is rapidly deflected back and forth across the aperture 65 bursts or pulses of electrons are directed therethrough to achieve the desired sampling of the input analogue signal. The deflection sampling as described herein is inherently fast because the beam of electrons directed toward the plate 64 can be deflected or moved at a rate proportional to the frequency of the signal applied to the sampling deflection plates 60, and the resultant sampling frequency $f_s$ is twice the deflection frequency due to the fact that the deflected electron beam traverses the aperture 65 twice per cycle. As a result, this deflection sampling achieves a sampling frequency equal to that bandwidth limit established by the Shannon theorem. If the distance between the electron gun 52 and the sampling plate 64 is maintained relatively large, i.e., several orders of magnitude larger than the diameter of the aperture 65, deflection sensitivities in the order of several millimeters per volt can be readily achieved and the sampled electron beam will have small transverse components which could cause errors in a multi-bit, analogue to digital converter as to be described herein.

It is desired to eliminate any effect that the deflection of the electron beam to achieve a high sampling rate may have on the subsequent deflection of the electron beam to achieve the desired analogue to digital conversion. With regard to FIG. 3, the desired isolation is achieved by deflecting the electron beam across the sampling plate 64 in a vertical or Y orientation and for deflecting subsequently the electron beam in an X orientation which is substantially perpendicular to the Y orientation of the sampling deflection. More specifically, the electron beam emerging from the aperture 65 is deflected by a pair of deflection plates 66 or a suitable traveling wave device, which are connected to an analogue signal input source 68. The electron beam traversing plates 66 is deflected in the X orientation in accordance with the amplitude of the input analogue signal applied to the deflection plates 66. The target assembly 70 illustratively includes a support plate 72 upon which there is mounted two semiconductor target elements 74 similar to that described above with regard to FIG. 2. Individual terminals 73 are connected to the semiconductor target elements 74 to provide digital signals indicating a plus of minus (1 or 0) signal and whether the electron beam is being deflected to the right or left by the input analogue signal applied to the deflection plates 66. As shown in FIG. 3, the semiconductor target elements 74 are elongated and are disposed along the Y axis to compensate for the deflection sampled traverse drift of the electron beam. The amplitude of deflection of the input analogue signal may be set to adjust the relative interval of the sampling pulse to the sampling period. The input analogue signal level must be set such that the maximum excursion across the surface of the target assembly 70 does not exceed the placement of the individual semiconductor elements 74 or a corresponding output signal will not be provided from either target element 74. The concept of placing the sampling deflection perpendicular to the analogue signal deflection can be extended to multi-bit devices as discussed later to within limits imposed by the lens action of the sampling aperture, whose diameter will be set small so that no electric potential gradients are imposed in its neighborhood. Further, this concept may also be extended to use with deflection circuits as shown in the electron discharge device 10 of FIG. 1.

Figure 5:
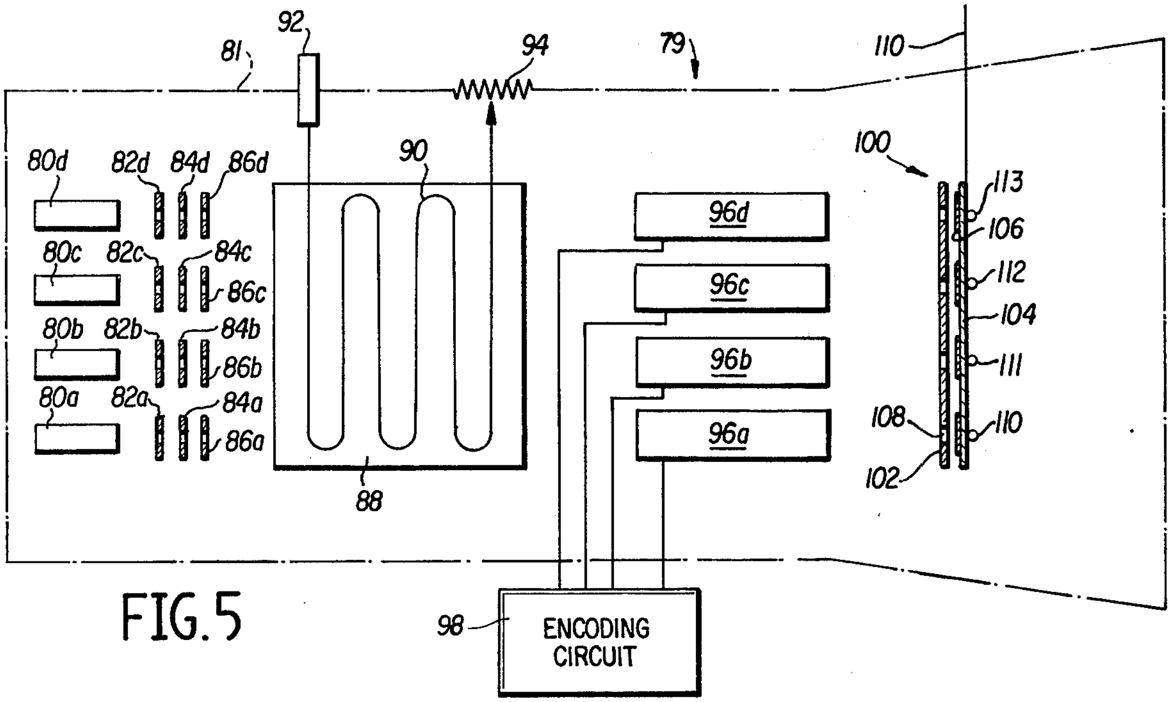
FIG. 5 is a still further embodiment of the electron discharge device of this invention for providing digital output signals in a binary fashion.

The digital signals derived from the electron discharge devices as shown in FIG. 1 and FIG. 3 are achieved by equally spacing the target elements along the electron beam deflection path to derive digital signals each indicative of preselected levels of the analogue signal. In order to derive parallel signals which as a group are encoded to indicate in a binary fashion the amplitude of the input analogue signal, an electron discharge device 79 is shown in FIG. 5 with a target assembly 100 which is more fully shown in FIG. 6. In order to provide an N bit encoded signal, it is necessary to generate N beams of electrons which are deflected simultaneously by a common deflection circuit across the target assembly 100. In the illustrative embodiment shown in FIG. 5, four separate electron guns are shown and identified by the suffixes *a*, *b*, *c* and *d*. Each of these electron guns is substantially identical and includes a cathode element 80 and a plurality of grid elements 82, 84 and 86 for defining and accelerating their respective electron beams. In a manner similar to that explained above with regard to FIG. 1, a deflection circuit in the form of a meander line 90 serves to deflect the electron beams simultaneously in accordance with the amplitude of the input analogue signal which is applied through an input terminal 92 to the meander line 90. An impedance 94 may be connected to the output of the meander line 90 in order to prevent reflected waves therethrough. The deflection circuit also includes a base plate 88 for establishing between the plate 88 and the meander line 90 a suitable traveling wave for deflecting the electron beam.

Figures 6, 7A, 7B:
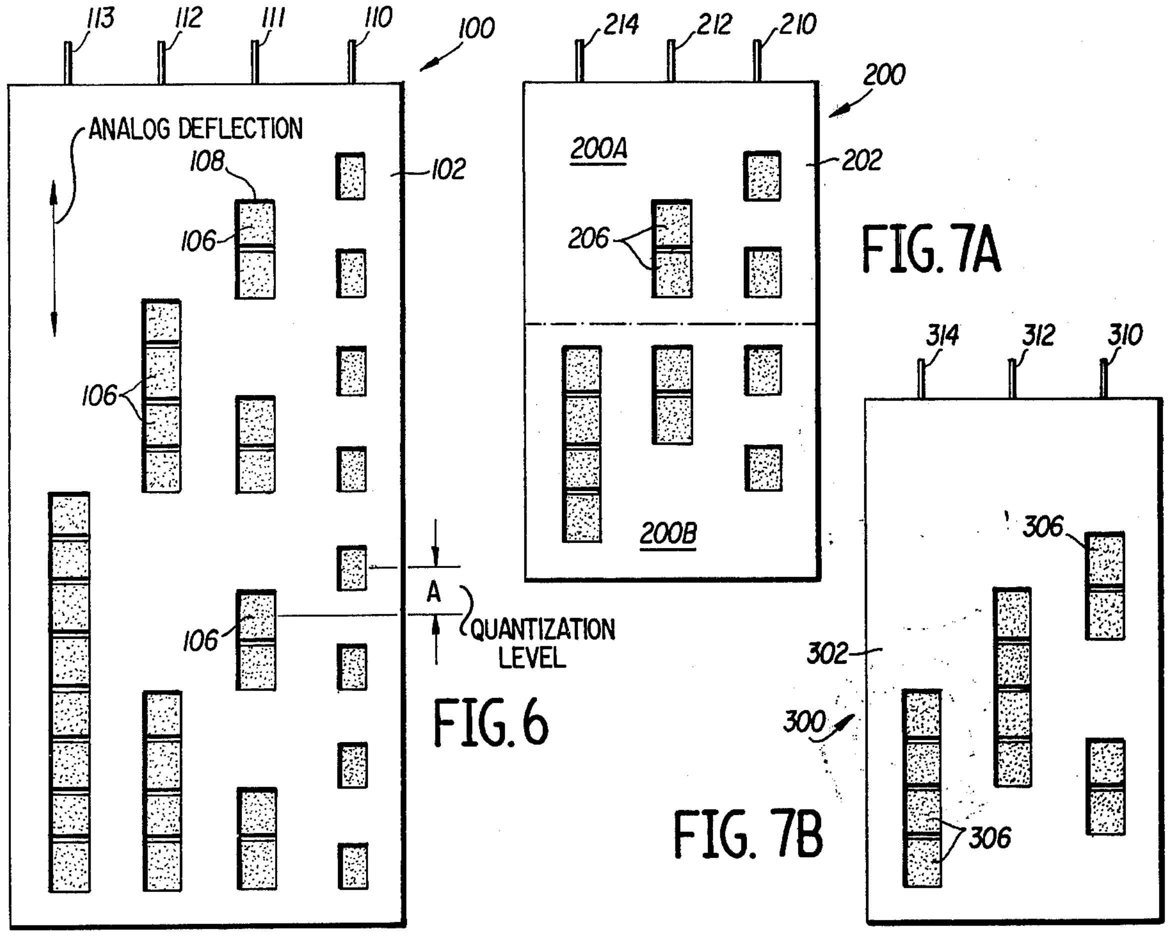
FIG. 6 is a plan view of the target assembly to be incorporated into the electron discharge device of FIG. 5.
FIGS. 7A and 7B are plan views of alternate embodiments of a target assembly which may be incorporated into the electron discharge device of FIG. 5.
Figure 8:
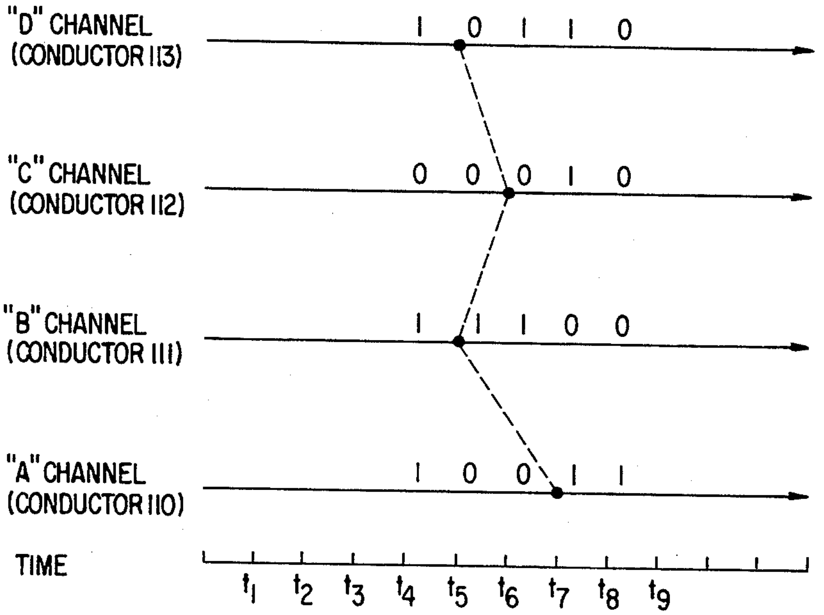
FIG. 8 is a graphical representation of the encoding provided to each of the N channels of the digital output signals derived from the electron discharge device of FIG. 5.

With reference to FIGS. 5 and 6, there is shown the target assembly 100 as including an apertured plate 102 through which the electrons are selectively transmitted onto semiconductor target elements 106 (similar to that described with regard to FIG. 2) which are mounted upon a suitable support plate 104. As more clearly indicated in FIG. 6, the apertured plate 102 has a plurality of apertures 108 disposed in a patterned array to provide from a corresponding plurality of output terminals 110, 111, 112 and 113, digital signals which are encoded in a binary fashion. At least one semiconductor target element 106 is disposed behind each of the apertures 108. Reference is made to the following chart in which there is shown an easily recognized four bit encoding of the arabic numbers 0 to 15;

| Binary Numbers | Arabic Numbers |
|---|---|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |
| 1100 | 12 |
| 1101 | 13 |
| 1110 | 14 |
| 1111 | 15 |

With reference to FIG. 6, it may be seen that the apertures 108 are so configured that individual target elements 106 may be disposed in a pattern determined by the placement of the 1's in the above-identified chart, i.e., a single target element 106 is disposed at each 1. By connecting the target elements 106 disposed in each of the four vertical rows corresponding to a bit of the binary code, separate digital signals may be derived from each of the output terminals 110, 111, 112 and 113 corresponding to the 1's, 2's, 4's and 8's bits of the binary code. Thus, the apertured plate 102 transforms the analogue deflection signals into parallel digital signals encoded in a binary fashion. With regard to FIG. 6, as each of the four electron beams are scanned from the top to the bottom of the target assembly 100, corresponding signals will be derived from the terminals 110, 111, 112 and 113 in parallel fashion indicative as in binary code of the amplitude of the input analogue signal which as explained above determines the degree of deflection. For example, if the beams of electrons are deflected to that level indicated by the dotted line in FIG. 6, output signals will be derived in parallel fashion indicating a 1101 binary number corresponding to an analogue signal having an amplitude 13.

A unique application of the electron discharge device 79 shown in FIG. 5 would be to provide a digital signal where each binary channel is transmitted by radio upon its own carrier frequency or upon its own individual conduit path in an encoded manner to prevent detection by others thereby maintaining the security of the transmitted message. Such pseudo or security coding is provided by disposing a delay lens 96 to intercept each of the electron beams and to provide selected, discrete delays to each of the electron beams. A suitable encoding circuit 98 is connected to each of the delay lenses 96*a*, 96*b*, 96*c* and 96*d* to apply suitable potentials to each of the lenses corresponding to the desired delay to be imparted to each electron beam and channel of transmission. In an illustrative embodiment of this invention, the lenses 96 could be Einzel lenses as more fully described in *Theory and Design of Electron Beams*, by J. R. Pierce (De Van Nostrand, 1949). The effect of providing selective delays to the electron beams and therefore to the signals derived from the output terminals 110, 111, 112 and 113 is shown in FIG. 7. It is noted that the terminals 110, 111, 112 and 113 correspond respectively to channels A, B, C and D. In the graph of FIG. 7, the times $t_1$, $t_2$ and $t_3$, etc., are indicative of the sampling times applied to the input analogue signal. Illustratively, various delays could be imparted to the signals derived upon the channels A, B, C and D; as indicated by the dotted line, two units of delay were imparted to channel B, one unit of delay imparted to channel C, and two units of delay were imparted to channel D with respect to the signal transmitted upon channel A. The security encoded signal may be reconstructed upon reception to provide a digital signal indicative of the binary number 1100. A party trying to detect the security encoded signal would only note the parallel signal corresponding to the discrete times and not being privy to the method of encoding, would not be able to reconstruct the coded information.

An upper limit on how fast binary information of this type could be encoded is caused by the differences in the path length different binary signals are required to travel along the respective output terminals 110, 111, 112 and 113. For example, if the phase velocity of the signal along the terminal 110, as loaded by the relative dialectic constant of Si, is about one-third of the speed of light, and the height of the apertured plate 102 is approximately one inch, a sequence involving the largest binary signal and a zero signal would coincide at the output of their original time separation were in the order of 0.25 nano seconds. Thus for the target illustratively described above, this system of security coding would be limited to approximately a one to two GHz word rate range. A further limit to the encoding rate arises from the particular nature of electrons in the deflected wave. If we desired to provide output signals from the terminals 110, 111, 112 and 113 in the order of tens of micro amps, the corresponding current density of the electron pulses or bursts would be in the order of tens of electrons per smallest binary bit. The number of electrons per burst must be maintained above a certain level in order to be detected by the individual semiconductor target elements without statistical confusion. The theory of shot noise indicates that there will be a large uncertainty of the number $n$ electrons in a burst of the order of $\sqrt{n}/n$.

The target assembly 100 may be replaced by other target assemblies where it is desired to code the output signals in a different manner. With reference to FIG. 7A, there is shown a target assembly 200 which may be incorporated into the electron discharge device 79 shown in FIG. 5. More specifically, the target assembly 200 includes an apertured plate 202 through which electrons are directed onto semiconductor elements 206 similar to that shown in FIG. 2. The target elements 206 disposed within a column are connected to the corresponding output terminals 210, 212 or 214. The target elements 206 are arranged to obtain output signals in accordance with the following code:

```
000
001
010
011   reference line
---
111
110
101
100
```

The electron beam is deflected by an analogue signal going positive and negative with respect to a zero level. A positive analogue signal will direct electrons onto the top portion 200A of the target assembly 200 whereas a negative signal will direct the electron beam onto the bottom portion 200B of the target assembly 200. The coding may be considered to be a two bit binary code with the third bit indicating whether the deflection signal is positive, i.e., 0, or negative, i.e. 1. The coding below the reference line is inverted with respect to that two bit code above the reference line so that the coded output signal indicates the magnitude of the analogue signal from the zero bias level.

Another embodiment of the target assembly is shown in FIG. 7B for providing a three bit, gray binary code. In particular, the target assembly 300 includes an apertured plate 302 through which the electrons are directed onto the target elements 306, similar to that shown in FIG. 2. As may be easily recognized, the target elements 306 are disposed in accordance with the pattern of 1 of a gray binary code. The target elements 306 disposed in a single column are connected to one of the output terminals 310, 312, or 314 to provide gray coded output signals.

The electron discharge device as described with regard to FIGS. 5 and 6 for providing digital output signals in a binary format, is particularly adapted for use in a radar or similar transmission system as to be now described. Mechanically scanned antennas for radar transmission and reception are being gradually replaced by phased array antennas comprised of a plurality of individual radiating elements disposed in a plane and arranged in either a linear or two-dimensional array. The wave radiated from this antenna may be directed toward a specific target or scanned in a desired pattern by applying pre-selected phase delays to the input signals applied to the radiating elements of the array. Typically, devices known as phase shifters are incorporated in the transmission path to each element of the antenna array and are respectively energized to provide the desired phase shift to the radiated wave.

There are a number of ways in which the phase shifters in a phased array may be separately controlled to generate a wave or beam directed along a specific path from the antenna. Systems have been developed as described in U.S. Pat. No. 3,478,358 in which computers calculate for each beam position individual settings for the phase shifter. Such calculations may take into account that any non-random or periodic errors incurred in generating the radiated beam may give rise to undesired grating lobes. By simply programming the computer, phase shift corrections may be made for each of the radiating elements to compensate for the problem created by the grating lobes. Where binary phase shifters are used, these correction factors may be previously calculated in terms of a set of binary phase shifter settings and stored, as disclosed in U.S. Pat. No. 3,478,358, in the computer memory.

Figure 9:
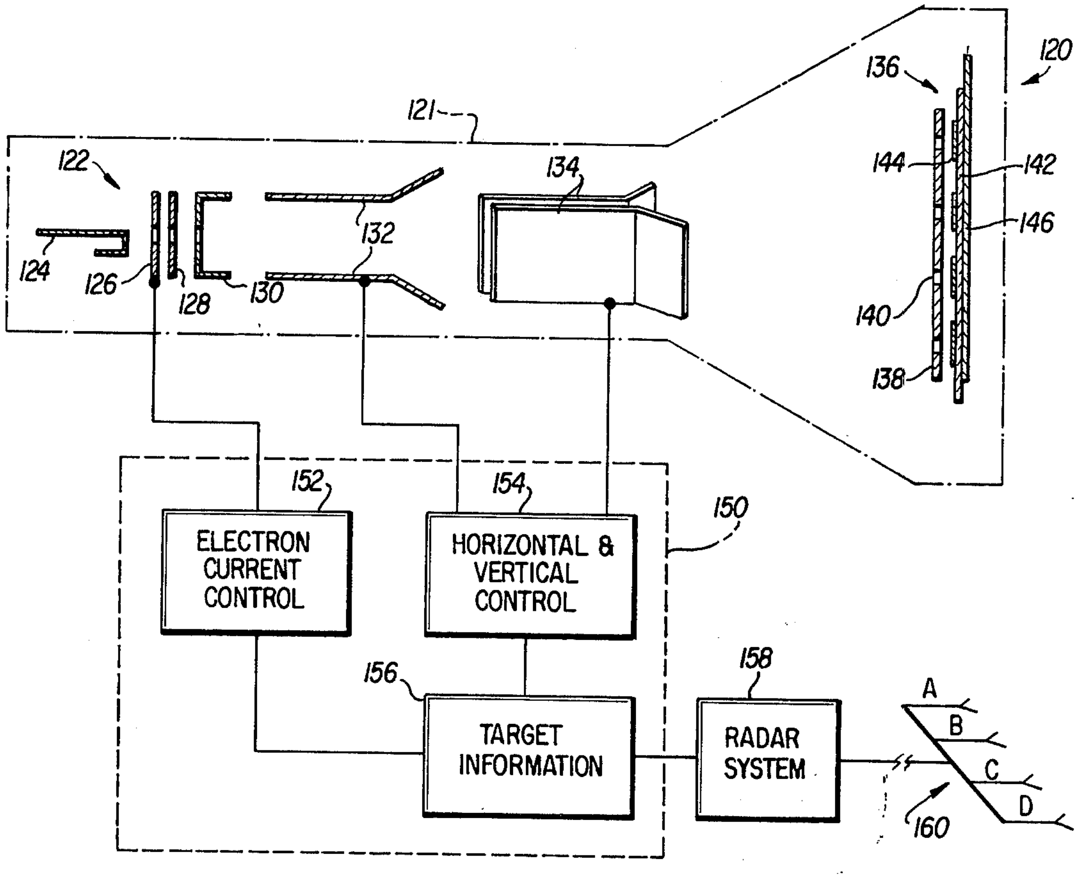
FIG. 9 is a schematic representation of an electron discharge device in accordance with a further embodiment of this invention particularly adapted to selectively energize the elements of an antenna array.

With reference to FIG. 9, where is shown an electron discharge device 120 for providing a series of digital output signals corresponding to a set of binary commands for the individual phase shifters. Thus, a binary word composed of a set of digital signals may be computed to determine a particular beam position taking into consideration any compensation that may be needed to eliminate grating lobes without requiring the expensive storing of such codings in a computer memory. More specifically, the electron discharge device 120 includes an evacuated envelope 121 in which there is disposed an electron gun 122 for forming and directing a beam of electrons onto a target assembly 136. The target assembly 136 is so constructed to provide digital signals having a number of binary bits given by M×N, where $M$ is the number of elements in the antenna array 160 and $N$ is the number of bits in the phase shifters 164, 166 and 168 (see FIG. 9). It may be understood that only a fraction of all the possible permutations of M×N bits will be used. For example, the digital signals indicative of binary words in which all of the phase shifts imparted are of equal magnitude or ambiguous in that all of these impart the same boresight radiation pattern. Further, many phase distributions across the antenna array correspond to no useful radiation pattern. In particular embodiment, the electron gun 122 includes a cathode element 124 and a plurality of grid elements 126, 128 and 130. A unique aspect of this invention resides in the manner in which the electron beam generated by the electron gun 122 is deflected in a vertical and horizontal manner across the face of the target assembly 136. As will be explained in greater detail later, a control circuit typically taking the form of a computer 150 serves to deflect the electron horizontally and vertically so as to provide the desired phase shift to each of the elements of the antenna array 160. More specifically, a horizontal and vertical control 154 is illustrated to provide control signals to the horizontal deflection plates 132 and to the vertical deflection plates 134. As diagrammatically represented, the antenna array 160 is connected to a radar system 158 which supplied input signals to a target information circuit 156 to identify the location of the target upon which the radiated waves are being directed and deflected from. In turn, the horizontal and vertical control 154 senses the desired position of the target and the direction in which the transmitted beam should be directed to intercept the target.

Figures 10, 11:
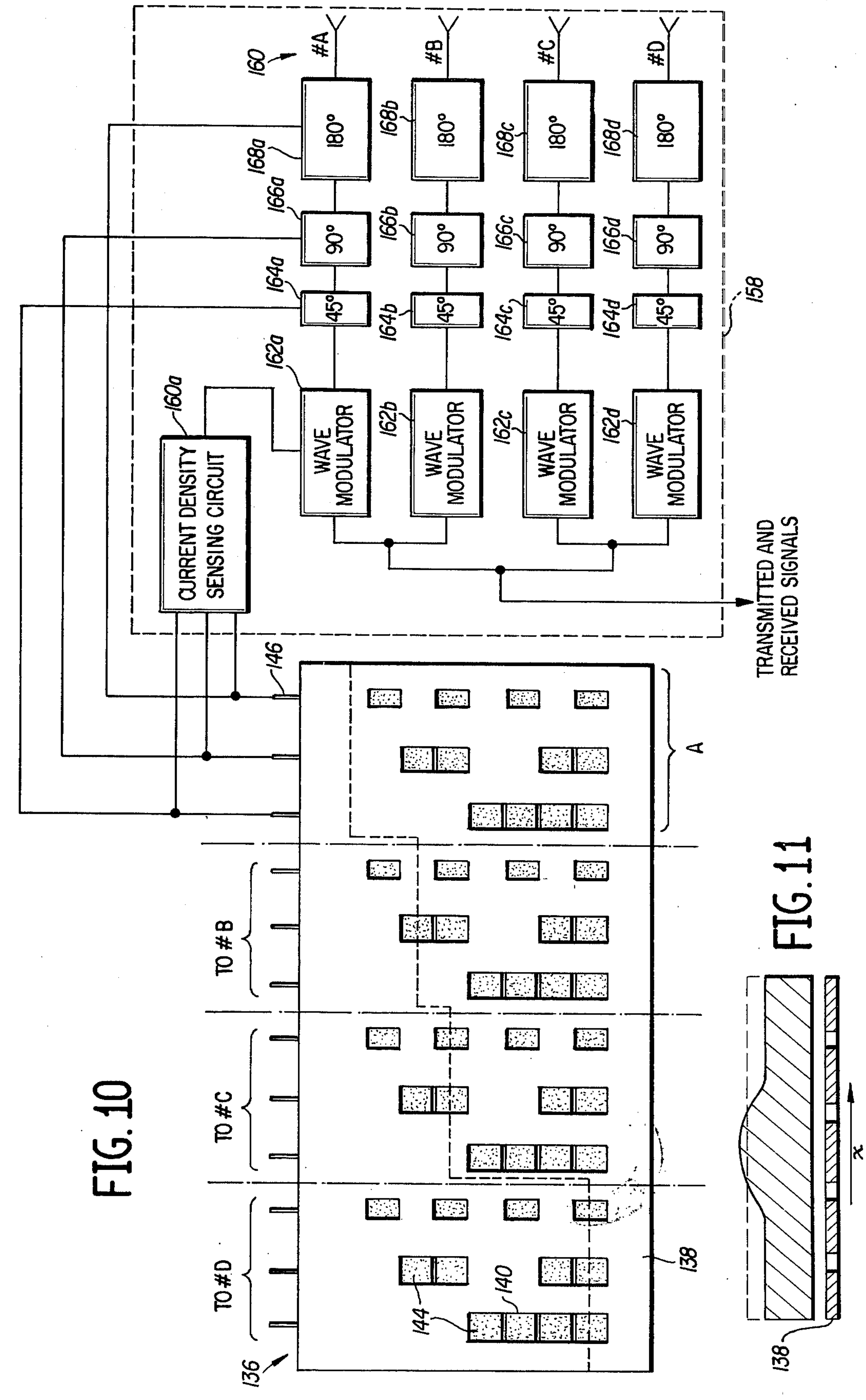
FIG. 10 is a schematic representation of the connection between the target assembly of the electron discharge device of FIG. 8 and the elements of the antenna array.
FIG. 11 is a graphical illustration of the variation in current density imparted to the electron beam as it scans across the target assembly of the electron discharge device of FIG. 8.

The electron beam is scanned along its X and Y coordinates across the target assembly 136, which is more fully shown in FIG. 10. More specifically, the target assembly 136 includes a support plate 142 upon which are mounted a plurality of target elements 114 substantially similar to that described with regard to FIG. 2. An apertured plate 138 is disposed to permit the electron beam to be directed through apertures 140 within the plate 138 and onto corresponding target elements 144. The manner in which the apertures 140 are arranged within the plate 138 is a significant feature of this invention. More specifically, it is noted that the antenna array 160 is illustratively shown as including four radiating elements A, B, C and D. It is, of course, understood that many additional elements could be added to the antenna array and typical systems currently used in the art would include possibly 50 to 100 such radiators for a linear array and perhaps as many as 2,500 to 10,000 elements for a two-dimensional array. With regard to FIG. 10, the apertured plate 138 is divided into portions or sections corresponding to each element and each such portion of the aperture plate 138 (and the aperture assembly 136) is used to provide a set of digital signals for controlling the phase delay of a corresponding radiating element. For the example more fully illustrated in FIG. 10, the portion A of the aperture plate 138 is associated with the element A of the antenna array 160 and would provide digital signals in a binary fashion to control the digital phase shifting devices 164*a*, 166*a* and 168*a*. Though not shown in FIG. 10, the portions of the target assembly 136 associated with the B, C and D channels are likewise connected with the corresponding phase shifting devices 164, 166 and 168. Each of these devices is identified by the subscripts corresponding with its radiating element. Thus in operation, an electron beam would be scanned across the surface of the aperture plate 138 to derive selective bit words from each portion of the target assembly 138 to provide the desired phase shift to the wave generated from each radiating element. The phase shifting devices 164, 166 and 168 may take the form of a suitable Ferrite phase shifter to which a signal is applied to incur a specified phase shift. It is noted that the phase shifters 164, 166 and 168 are designed to provide different phase shifts to the transmitted wave and in one illustrative embodiment, provide 45°, 90° and 180° phase shifts respectively.

Thus in operation, the beam of electrons is selectively deflected across the face of the target assembly 138 to impose a selective set of phase shifts to the wave transmitted from each of the antenna elements A, B, C and D dependent upon the target information and also the inherent characteristics of the antenna array. As illustratively shown in FIG. 10, the sweep of the beam is denoted by a staircase path shown in dotted lines. Each section of the target assembly 136 provides a digital output signal in a three bit, binary form providing information of a least eight levels of phase shift. More specifically, the electron beam scans portion A so as to provide no phase shift to the corresponding phase shift devices 164*a*, 166*a* and 168*a*. By applying a suitable signal to the vertical deflection plates 134, the portion B of the target assembly 136 is scanned to provide a binary word 010 to thereby energize the phase shifting 166*b* and to provide a 90° phase shift to the wave transmitted from radiating element B. In a similar manner, the binary words 011 and 111 are derived respectively from the C and D portions of the target assembly 136 to provide phase shifts of 135° and 315° to the waves generated from the elements C and D respectively.

A useful and unique feature of the invention is that the radar system computer no longer needs to calculate the optimum phase setting across the array to minimize periodic phase errors. These periodic errors arise when a phase front is not exactly matched by the phase shift settings. In fact, the desired phase shift match is rarely accomplished. In normal situations where a non-match situation exists, the radar system computer must compute the binary word that represents the least periodic phase error component. In accordance with the teachings of these inventions, these computations for all beam positions may be made prior to the design of the aperture plate and are "frozen in" to the computer system by a particular design of the aperture plate 138. Though an illustrative embodiment of this invention has been shown in FIGS. 9 and 10 as being adapted to energize an antenna array 160 of only four elements, it is estimated that 2,000 beam positions can be generated in a manner similar to that shown in FIG. 9 for antenna array having as many as 100 elements.

Considering a conventional linear array of radiating elements, the energy level of the waves transmitted from each of the elements is not uniform across the length of the linear array. In some cases it may be desirable to compensate for this non-linear distribution of energy by modulating the amplitude or level of energy of the wave radiated from each element of the antenna array. This control of the energy levels of the signals directed to each element of the antenna array may be referred to as array illumination tapering and can be accomplished in accordance with the teachings of this invention by using amplitude [analogue] information imposed upon the electron beam by modulating the current density of the electron beam as it sweeps across the face of the target assembly 136 along the X axis. This type of current modulation may be referred to as Z axis modulation. With regard to FIG. 9, there is shown an electron current control 152 associated with the computer 150. Thus, it may be desirable to provide an increase in the level of wave energy imparted to the elements disposed at the center of the array to detect more distant targets. The radar antenna beam may be zoomed, that is its beam width can be varied as the target range and beam angle vary with respect to the plane surface of the array. As shown in FIG. 11, a cross-sectioned area or graph is representative of the desired amount of energy to be imparted to these centrally oriented elements of the antenna array. This may be achieved by modulating the density of the electron beam as it is scanned in an X direction to achieve an increased current density along the central portion of the X sweep of the electron beam. As explained above, the incident electron beam causes signals to be generated upon the corresponding terminals 146 of the target assembly 136 which is connected to a current density sensing circuit 160. The circuit 160 is responsive to the current density to provide a controlled signal to a wave modulator 162. As indicated in FIG. 10, the current density sensing circuit 160 functions to sense the level of current density of the incident electron beam upon a particular portion of the target assembly 136 and to control the degree of modulation provided by the wave modulator 162 associated with the radiating element corresponding with that portion of the target assembly 136. For example, the wave modulator 162*a* is associated with the radiating element A and is controlled according to the current density of the electrons incident upon portion A of the target assembly 136 and directed to the corresponding terminal lines 146 connected to the current density sensing circuit 160*a*. In an illustrative example of this invention, the wave modulators 162 could take the form of a PIN diode type or Ferrite type modulator. Such modulators would be connected to the input signals from the other target assembly sections to modulate the wave energy radiated from its corresponding element and the energy levels of waves emitted from the remaining elements B, C and D would be controlled according to the desired taper. As indicated in FIG. 11, the desired array illumination taper may be changed from that indicated by the cross-hatched area to a substantially even taper as indicated by the dotted line. It is noted that as a target approaches the radar system, it may be desired to provide a wave radiated from the antenna array with an energy distribution that is lower at its central portion; thus, an array illumination tapering according to the dotted lines shown in FIG. 10 would provide such an energy distribution and in certain situations will be more suitable for detecting relatively close targets.

In an illustrative example of this invention, the antenna array could be provided with ten elements with a five bit phase shifter system associated with each element. The target assembly may illustratively assume a dimension of a 4-inch square and achieve 2,000 beam positions between the plus and minus 60° points. The apertured plate could have 2,000 binary words of 50 bits apiece, and the Y axis may be divided into 2,000 beam positions, with a 2 mill spacing therebetween. The X axis of the target assembly may be divided into 50 output channels carrying video commands to the ten - five bit phase shifting devices. The output channels may be disposed about 0.080 inches apart, which spacing is well within the art for forming thin logic circuitry.

Accordingly, while specific embodiments of the invention have been described herein, it will be apparent that variations and modifications of the invention will be apparent to those of ordinary skill in the art from a consideration of the foregoing description. It is therefore desired that the present invention be limited only by the appended claims.

What is claimed is:

1. Apparatus for converting an analogue input signal of varying amplitude into corresponding digital signals, said apparatus comprising:

means for forming a beam of electrons;

a sampling plate for sampling the beam of electrons at a relatively high rate;

deflection means for deflecting the beam of electrons an amount dependent upon the varying amplitude of the analogue input signal; and target means disposed to intercept the deflected beam of electrons and comprising a plurality of target portions, each responsive to the deflected electron beam for multiplying the incident electrons and for producing an amplified signal corresponding thereto, said target portions being so arranged with respect to the deflected electron beam and selected ones of said portions being so interconnected to provide a plurality of digital signals representative of discrete levels of the amplitude of the input signal.

2. Apparatus as claimed in claim 1, wherein said deflection means provides a wave traveling in synchronism with the electron beam.

3. Apparatus as claimed in claim 1, wherein said target portions include a semiconductor member having formed therein a PIN junction and means for applying a back biasing potential across said PIN junction.

4. Apparatus as claimed in claim 3, wherein said biasing means includes an electrode member disposed upon said semiconductor member, said apparatus further including means for accelerating the electron beam to a velocity sufficient to be directed through said electrode member and into said semiconductor member.

5. Apparatus as claimed in claim 2, wherein said deflection means comprises at least one meander line to which the input analogue signal is applied.

6. Apparatus as claimed in claim 1, wherein said sampling means includes means for defining an aperture and disposed to intercept the beam of electrons, and second means for deflecting the electron beam across said aperture to intermittently direct electrons through said aperture.

7. Apparatus as claimed in claim 1, wherein said target portions are so arranged and selected ones of said target portions are connected to a particular one of N output terminals to generate output signals in an N-bit Gray, binary code.

8. Apparatus as claimed in claim 7 wherein said target portions are disposed in a pattern corresponding to the 1's of the following Gray binary code:

000
001
011
010
110
111
101
100

9. Apparatus as claimed in claim 1, wherein said target means comprises a first set of target portions disposed on one side of a reference line, and a second set of target elements disposed on the other side of said reference line, said first and second sets of target elements being arranged in coding patterns to provide unique first and second sets of output signals indicative of its respective set;

said deflection means responsive to an analogue input signal having an amplitude varying above and below a given bias level for directing the beam of electrons onto said first and second sets of target portions, respectively.

10. Apparatus as claimed in claim 9 wherein said first and second sets of target elements are disposed on either side of said reference line in a pattern corresponding to the 1's of the following binary code:

000
001
010
011 — said reference line
111
110
101
100.

11. Apparatus for converting an analogue input signal of varying amplitude into corresponding digital signals, said apparatus comprising:

means for forming a beam of electrons;

means disposed to intercept the beam of electrons for defining an aperture;

first means for deflecting the electron beam across said aperture defining means to periodically transmit the electron beam through said aperture at a relatively high rate;

second deflection means for deflecting the beam of electrons an amount dependent upon the varying amplitude of the input analogue signal; and target means disposed to intercept the deflected beam of electrons and comprising a plurality of target portions each responsive to the incident electron beam for producing a signal, said target portions being so arranged with respect to the deflected beam of electrons and selected ones of said portions being so interconnected to provide a plurality of digital signals representative of discrete levels of the amplitude of the input analogue signal.

12. Apparatus as claimed in claim 11, wherein each of said target portions is responsive to the incident electron beam to multiply the electrons to provide an amplified signal corresponding thereto.

13. Apparatus as claimed in claim 12, wherein said target portions include a semiconductor body having formed therein a PIN junction and means for applying a back-biasing potential across said PIN junction.

14. Apparatus as claimed in claim 12, wherein said semiconductor body exhibits the property of electron avalanche across said back-biased junction in response to incident electrons.

* * * * *